(12) United States Patent
Fujikawa et al.

(10) Patent No.: US 6,221,743 B1
(45) Date of Patent: Apr. 24, 2001

(54) METHOD FOR PROCESSING SUBSTRATE

(75) Inventors: Takao Fujikawa; Yutaka Narukawa; Itaru Masuoka, all of Takasago; Kohei Suzuki, Kobe, all of (JP)

(73) Assignee: Kabushiki Kaisha Kobe Seiko Sho, Kobe (JP)

( * ) Notice: Subject to any disclaimer, the term of this patent is extended or adjusted under 35 U.S.C. 154(b) by 0 days.

(21) Appl. No.: 09/111,377

(22) Filed: Jul. 7, 1998

(30) Foreign Application Priority Data

Jul. 7, 1997 (JP) .................................................. 9-181380

(51) Int. Cl.$^7$ ................................................ H01L 21/425
(52) U.S. Cl. .......................... 438/530; 438/370; 438/480; 438/440
(58) Field of Search .................................... 438/766, 480, 438/407, 423, 404, 530, 440, 370

(56) References Cited

U.S. PATENT DOCUMENTS 5,658,809 * 8/1997 Nakashima ............................ 438/766
5,895,274 * 4/1999 Lane et al. ............................ 438/795
5,918,136 * 6/1999 Nakashima ............................ 438/404

OTHER PUBLICATIONS

S. Wolf, Silicon Processing for the VLSI era, vol. 1, 1997, 216–218.*

* cited by examiner

Primary Examiner—Mary Wilczewski
Assistant Examiner—David Goodwin
(74) Attorney, Agent, or Firm—Oblon, Spivak, McClelland, Maier & Neustadt, P.C.

(57) ABSTRACT

The present invention provides a method for processing a substrate in which crystal defects occurring according to ion implantation can be prevented from being integrated to form defects such as dislocation or large vacancies in the manufacture of a SIMOX substrate by implanting oxygen atom to a Si base by ion implantation and reacting it with Si to form a buried oxide film. The annealing after ion implantation is performed under a gas atmosphere pressurized to, for example, about 100 MPa. In the pressurized state, a structure having a smaller volume is thermodynamically more stable, and a behavior as increases crystal distortion is arrested in the annealing. Thus, crystal defects can be laid in uniformly dispersed state, vacancies can be also extinguished, and a Si base of good quality suitable for manufacture of ULSI in which defects such as dislocation are reduced can be provided.

9 Claims, 2 Drawing Sheets

FIG. 2a OXYGEN ION IMPLANTATION

FIG. 2c HIGH-TEMPERATURE ANNEALING

METHOD FOR PROCESSING SUBSTRATE

BACKGROUND OF THE INVENTION

1. Field of the Invention

The present invention relates to a method for processing a substrate in which occurrence of defects after ion implantation can be suitably prevented, for example, in a Si semiconductor substrate.

2. Description of the Prior Art

In the field of manufacturing Si semiconductors, recently, SOI (Silicon on Insulator) technique capable of providing a high-speed, low-power consumption LSI is advancingly developed, and SIMOX (Separation by Implanted Oxygen) has attracted attention as a method for manufacturing a wafer necessary for this.

According to this method, oxygen atom ion $O^+$ is implanted to a Si wafer 20 heated to 500–650° C. by ion implantation in the order of $10^{17}$–$10^{18}$/cm$^2$ as shown in FIG. 2(a). The accelerating voltage in this ion implantation is set to about 200 kV, whereby the oxygen ion is dosed to the area of several 10 to several 100 nm from the surface (hereinafter referred to as a dosing area 21).

A heating treatment to a temperature equal to or higher than 1300° C. for 6–10 hours (high-temperature annealing) is successively performed in an inert gas such as Ar or an mixture gas of Ar and oxygen added thereto. The oxygen atom implanted to the dosing area 21 is reacted with Si by this annealing to form a buried oxide film 22 formed of silicon dioxide ($SiO_2$) having a substantially uniform thickness in a specified depth from the surface as shown in FIG. 2(b).

By use of a substrate having the buried oxide film 22 thus formed thereon (hereinafter referred to as a SIMOX substrate 20'), a device formation is performed in a Si layer 23 of 10–500 nm on the surface side from the buried oxide film 22, or the part insulated from a Si base layer 24 on the lower side by the buried oxide film 22 to form an element, whereby a high-speed, low-power consumption LSI can be manufactured.

However, the conventional SIMOX substrate 20' formed according to the above method has a problem in that defects as reduce the manufacturing yield or reliability can not be sufficiently reduced in the manufacture of an ULSI (IC with ultra-high integration degree) in which integration of elements is further advanced.

Namely, in the above-described manufacturing process, in the substrate 20 after ion implantation, crystal defects such as atomic vacancies Dv . . . in the surface Si layer 23, substitutional lattice defects Dc . . . in which O atom is substituted by Si atom, interstitial lattice detects Di . . . in which O atom is penetrated between atoms, and the like occur in large quantities according to the ion implantation as shown in FIG. 2(c). The high-temperature annealing after ion implantation leads to a behavior as these crystal defects are mutually integrated, resulting in a change to defects of a larger level as large vacancies PV (Piled up Vacancies), stacking fault SF, or dislocation DF as shown in FIG. 2(d), and these are existing in the SIMOX substrate 20'. Further, the buried oxide film 22 is not necessarily a chemically stable $SiO_2$ layer.

Although it is conventionally adapted to change the temperature, time, temperature rising speed or the like in the annealing in order to reduce such defects, dislocation of a high density in the order of $10^9$/cm$^2$ still remains in a high dose substrate having a dose of about $2\times10^{18}$/cm$^2$. It is also reported that the dislocation density can be significantly reduced by changing the dose of oxygen ion to about $4\times10^{17}$/cm$^2$. However, it is the actual state that the dislocation density is about $10^2$/cm$^2$ even in that case, which is still insufficient to be applied to ULSI.

SUMMARY OF THE INVENTION

The present invention has been achieved to solve the above-mentioned problems. An object of the present invention is to provide a method for processing a substrate in which occurrence of defects after ion implantation can be suitably prevented to a substrate functionalized by ion implantation as the above-mentioned SIMOX substrate, or a substrate reformed in the vicinity of the surface by ion implantation.

As the earnest studies on the relation between high-temperature annealing condition after ion implantation and occurrence of defects in order to attain the above object, the present inventors have found that the high gas pressure in annealing has a significant effect on the behavior of crystal defects occurring according to ion implantation, and attained the present invention.

Namely, a method for processing a substrate according to the present invention in which occurrence of defects after ion implantation can be prevented, for example, in a Si semiconductor substrate is characterized by annealing the substrate under a pressurized gas atmosphere in order to suppress the integration of crystal defects occurring according to ion implantation.

When the annealing is performed under the pressurized gas atmosphere, the behavior of crystal defects becomes different from the previous one. Namely, under the atmospheric pressure or vacuum, the crystal defects in the substrate are laid in thermodynamically more stable state by being collected in a specific part, resulting in the formation of dislocation or large vacancies. In the pressurized state, on the other hand, the structure having a smaller volume is thermodynamically more stabile. Thus, the behavior as increases crystal distortion is arrested to form a state where the crystal defects are uniformly dispersed, and the vacancies can be also extinguished. At a result, occurrence of defects by the integration of crystal defects can be prevented.

When a specified element ion is collectively implanted to a specified depth from the surface of a substrate to be processed, and the implanted element is then reacted with the constituting element of the substrate to be processed by the above-mentioned annealing under pressurized gas atmosphere to form a compound layer, occurrence of defects which was previously apt to be caused in the critical surfaces of the compound layer with the bases (base material) nipping it can be also prevented.

Namely, the formation of the compound as described above generally accompanies a volume expansion. In this case, a stress is generated in the critical surface with the base material, whereby a large quantity of dislocations and, further, defects such as micro-cracks in an extreme case occur in the base material. Although a volume contraction accompanied by the compound formation is also known, large vacancies are formed in the vicinity of the critical surface in such cases.

In the thermal treatment accompanying the generation of a compound as described above, the dislocation or cracking can be prevented by heating to a temperature such that the constituting atom can be diffused in the pressurized state, and vacancies can be extinguished when formed.

Accordingly, when a compound layer formed of silicon dioxide is formed by annealing under a pressurized gas atmosphere by use of a silicon monocrystal substrate as the substrate to be processed and oxygen as the element to be ion-implanted, a substrate having a buried oxide layer in which lattice defects such as atomic vacancies and interstitial atoms in ion implantation are never changed to large defects, or a specific tissue or defect never occurs in the vicinity of the critical surface of the compound layer with the base material can be formed. Thus, a Si semiconductor substrate of good quality suitable for manufacture of ULSI can be provided.

BRIEF DESCRIPTION OF THE DRAWINGS

FIG. 1 shows the manufacturing process of a SIMOX substrate manufactured by applying the present invention, wherein

FIG. 2 shows a conventional manufacturing process of a SIMOX substrate, wherein FIG. 2(a) is a sectional schematic view of the substrate in ion implanting process, FIG. 2(c) is a schematic view showing the atomic arrangement in the substrate after ion implantation.

DESCRIPTION OF THE PREFERRED EMBODIMENT

One embodiment of the present invention in which a Si monocrystal wafer is used as the substrate to be processed, and a buried oxide film is formed therein by the above-mentioned SIMOX technique will next be described.

Figure 1A:
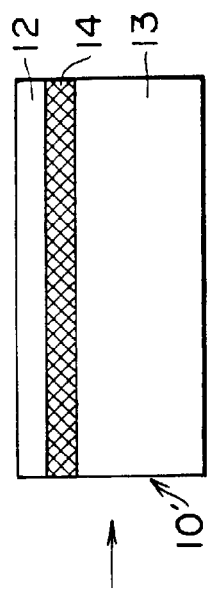
FIG. 1(a) is a sectional schematic view of the substrate in ion implanting process.

As shown in FIG. 1(a), oxygen atom ion $O^+$ is implanted to a Si wafer 10 as the substrate to be processed by ion implantation. The Si wafer 10 is preliminarily heated to a temperature of 500–650° C., and oxygen ion is implanted to the area of several 10–several 100 nm from the surface of the Si wafer 10 (herein referred to as a dosing area 11) in the order of $10^{17}$–$10^{18}$/cm$^2$ with an accelerating voltage set to about 200 kV.

Figure 2B:
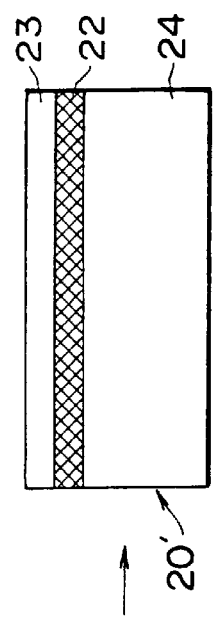
FIG. 2(b) is a sectional schematic view of the substrate after high-temperature annealing.
Figure 2B:
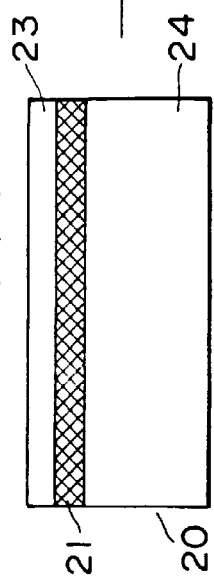
Figure 2B:
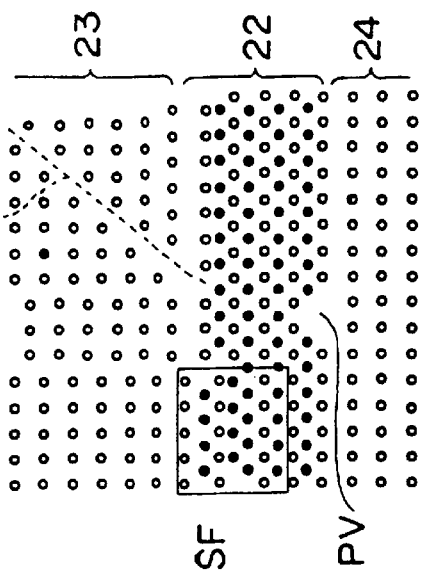
Figure 2D:
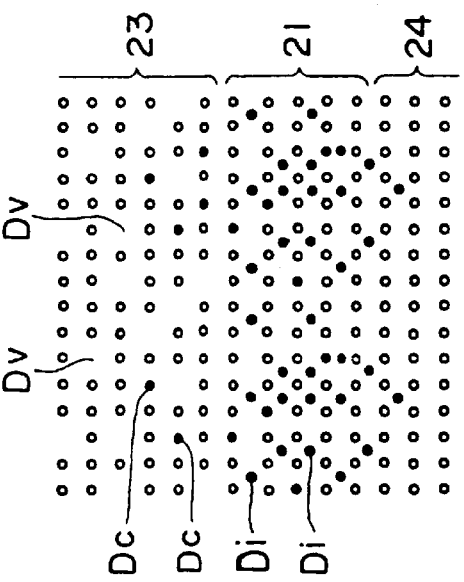
FIG. 2(d) is a schematic view showing the atomic arrangement in the substrate shown in FIG. 2(b).

According to such an ion implantation, atomic vacancies Dv . . . , substitutional lattice defects Dc . . . , and interstitial lattice defects Di . . . occur in large quantities in the surface-side layer from the dosing area 11 (hereinafter referred to as a surface Si layer 12) as shown in FIG. 2(b).

In order to react the dosed oxygen ion with Si, a heating treatment is performed at a temperature equal to or higher than 1300° C. In this treatment, a high-temperature, high-pressure device such as HIP (hot isostatic pressing) device heatable under a high pressure gas atmosphere is used, and the pressure of an inert gas as Ar or an atmospheric gas of Ar and oxygen added thereto is set to 10 MPa or more, preferably about 100 MPa (high-temperature high-pressure annealing).

Figure 1C:
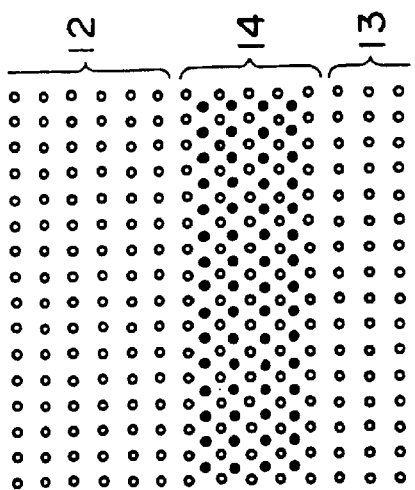
FIG. 1(c) is a sectional schematic view of the substrate after high-temperature, high-pressure annealing.
Figure 1B:
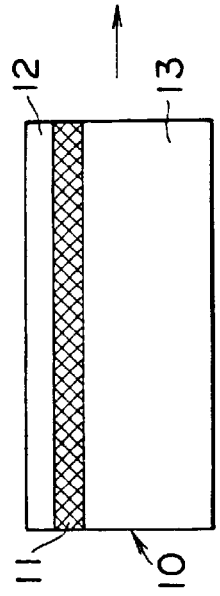
FIG. 1(b) is a schematic view showing the atomic arrangement in the substrate after ion implantation.

By this treatment, the oxygen atom implanted to the dosing area 11 is reacted with Si, and a SIMOX substrate 10' having, in a specified depth from the surface, a buried oxide film 14 formed of silicon dioxide (SiO$_2$) with an uniform thickness whose critical surfaces with the surface Si layer 12 and the lower Si base layer 13 are smoothed is formed as shown in FIG. 1(c).

Figure 1D:
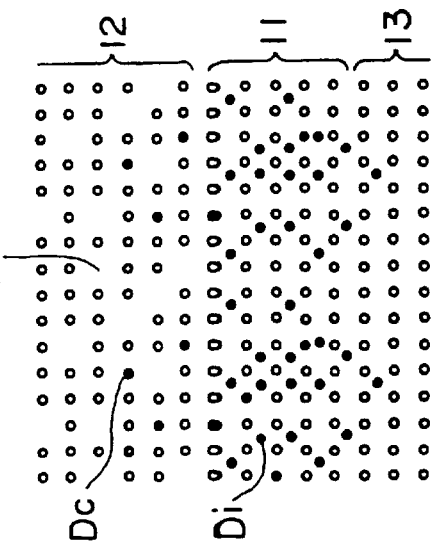
FIG. 1(d) is a schematic view showing the atomic arrangement in the substrate shown in FIG. 1(c).

This annealing is performed particularly under a high pressure gas atmosphere as described above, whereby a Si semiconductor substrate of good quality hardly having defects in the surface Si layer 12 and in the critical surfaces of the buried oxide film 14 with the upper and lower Si layers 12, 13 can be formed as shown in FIG. 1(d). This reason is described below.

A member formed of a material having a crystalline structure generally contains crystal defects in atomic level such as atomic vacancies and interstitial atoms more or less without being limited to the above Si. Under specified temperature and pressure, or under conditions other than absolute zero and vacuum, it is thermodynamically more stable to contain these crystal defects according to the condition. Thus, it is difficult to contain these defects not at all unless a specific state is formed. When such a material including crystal defects is heated and laid into the state causing atomic diffusion, it is changed to the more stable state. A behavior as collects these crystal defects to a specified position is caused under the atmospheric pressure or under vacuum, whereby dislocation or large vacancies are easily formed.

On the other hand, the structure having a smaller volume is thermodynamically more stable in the pressurized state. Thus, when the entire crystal distortion is increased according to the integration of crystal defects, such a behavior is arrested, and the crystal defects are held in more uniformly dispersed state.

The present invention is attained by paying attention mainly to such thermodynamic stability possessed by the material. Namely, the crystal defects occurring in ion implantation are mainly of atomic level as described above. These defects necessarily occur as far as ion implantation is employed, and it is impossible to perfectly avoid them. It is a defect in slightly larger level such as dislocation or a defect as present in unstable state and thereafter changed to a defect of large level that actually becomes a problem in the use as ULSI.

The unstable defect can be changed to a stable state to some degree by thermal treatment. However, a large quantity of crystal defects such as atomic vacancies or interstitial atoms formed according to ion implantation are mostly changed to unpreferable forms such as large vacancies (Piled up Vacancies), stacking fault, and the like by general thermal treatment. In the present invention, therefore, a pressure is imparted so as to suppress the behavior as integrates crystal defects in the thermal treatment, whereby the crystal defects are laid in more uniformly dispersed state as described above, or extinguished, so that occurrence of defects of large level can be prevented.

Further, when two kinds of elements are reacted in the thermal treatment to form a compound, as the SIMOX substrate described above, the volume after formation of the compound is generally varied from the volume in the state of the original two atoms. In most cases, the formation of the compound accompanies a volume expansion. It can be easily estimated that a stress accompanied by the volume expansion in the compound formation is generated, for example, in the critical surface between the area of the original base material and the area where the compound is formed. In such a case, a large quantity of dislocations and, further, micro-cracks in an extreme case are caused in the base material.

On the other hand, a case where the compound has the smaller volume is also known. It is known in such a case that large vacancies (Kirkendall void) are formed in the vicinity of the critical surface between the base material and the generated compound area. Such pore-like defects naturally mean the increase in volume.

Thus, even when such a thermal treatment accompanying the generation of the compound is performed, the above-mentioned occurrence of dislocations or micro-cracks in the vicinity of the critical surface can be prevented by heating to a temperature such that the constituting atom can be diffused in the pressurized state, and large vacancies can be also easily extinguished when formed.

According to the present invention, (1) a tissue containing crystal defects such as atomic vacancies or interstitial atoms can be made sound without changing them to large defects, and (2) a specific tissue or defect can be prevented from being generated in the vicinity of the critical surface between two kinds of material areas.

Consequently, a SIMOX substrate formed by applying the present invention, for example, contains no macro defect as causes a trouble in the application of functional characteristics of ULSI or the like, and can form a Si semiconductor substrate of good quality having an ideal composite structure as shown in FIG. 1(d).

The present invention is not limited to only the manufacture of the SIMOX substrate as described above, and applicable to the manufacture of other optional substrates in which a specified element ion is implanted to a specified depth area from the substrate surface and reformed to a compound layer, thereby forming a composite structure. In these cases, the essential requirement of the high-temperature, high-pressure naturally is to perform the heating to a temperature area as generates a compound phase.

On the other hand, the present invention is also applicable to the manufacture of a substrate such that the ion is implanted to reform the substrate surface side without accompanying the formation of a compound. The purpose of this application is to simply uniformly disperse the element to be ion-implanted, and a temperature capable of diffusing the constituting atom under high pressure gas atmosphere, generally, a temperature equal to or higher than the recrystallization starting temperature is sufficient for this heating. The recrystallization starting temperature means, as term, the temperature at which the constituting element is diffused within the crystal grain as described above, and [Tm×0.4+ 273] may be actually taken as a criterion to the melting point Tm (K) of the material.

The pressure value to be added is not particularly limited, but it is a pressure range of 10 MPa or more, preferably about 100 MPa that the above-mentioned effect can be provided. With a low pressure as 1 MPa, the effect of the present invention is small, and with a high pressure as 1 GPA, there is a possibility that a residual stress is generated in pressure reduction because of the difference in elasticity between dissimilar materials in the composite structure including the compound layer. The use of an excessively high pressure requires an extremely large-scaled device, which arises a problem from an economic viewpoint. When the use of such a high pressure is inevitably required, it is preferred, from the viewpoint of avoiding the above-mentioned generation of residual stress by the difference in elasticity, to reduce the temperature after reducing the pressure to a level lower than 100 MPa in the temperature range of the recrystallization starting temperature or higher, paying attention to the way of lowering the temperature and pressure in vacuuming.

The order of imparting the pressure and temperature is not significantly limited, but it is suitable for providing a remarkable effect of the present invention to raise the temperature under the atmospheric pressure or under vacuum up to the recrystallization starting temperature and raise the temperature and the pressure at the same time after reaching the recrystallization starting temperature. When the temperature is raised to a temperature range considerably higher than the recrystallization starting temperature in the state having no pressure, large defects are formed at this point of time. Although these defects are almost extinguishable by adding a pressure thereafter, they are often partially left. It is improper to add an excessively high pressure, for example, 200 MPa (the value dose to the yielding strengths of a number of materials) in the area lower than the recrystallization starting temperature. Under such a high pressure, the material is partially plastically deformed to induce a large quantity of dislocations. Thus, the influence of this dislocation is added besides the original defects.

As the atmospheric gas, an inert gas is preferably used in order to prevent the generation of an excessive compound by the reaction of the substrate material with the gas. The element to be ion-implanted is a gaseous element such as oxygen or nitrogen, the element is often partially scattered by heat. In order to prevent this, it is recommended to mix oxygen to the inert gas in the implantation of oxygen ion and nitrogen gas in the implantation of nitrogen ion to impart the partial pressure of the corresponding element.

Specific examples of the present invention are described below.

EXAMPLE

As shown in Table 1, SIMOX substrates each of which has a $SiO_2$ layer in a Si semiconductor substrate were formed with variously changing ion implanting condition of oxygen and annealing condition, and their dislocation densities were measured.

TABLE 1

| | Ion implanting condition*1 | | Annealing condition*2 | | | Evaluation result | |
|---|---|---|---|---|---|---|---|
| | Accelerating voltage (kV) | $O^2$ Dose (/cm$^2$) | Temp (° C.) | Pressure | Time (h) | Dislocation density (/cm$^2$) | Smoothness of critical surface |
| Ex. 1 | 180 | $2 \times 10^{18}$ | 1300 | 100 MPa | 5 | ~$10^2$ | Good |
| Comp. Ex. 1 | 180 | $2 \times 10^{18}$ | 1350 | Atmospheric pressure | 8 | ~$10^9$ | Good |
| Comp. Ex. 1' | 180 | $2 \times 10^{18}$ | 1300 | Atmospheric pressure | 8 | ~$10^9$ | Poor |

TABLE 1-continued

| | Ion implanting condition*1 | | Annealing condition*2 | | | Evaluation result | |
|---|---|---|---|---|---|---|---|
| | Accelerating voltage (kV) | $O_2$ Dose (/cm$^2$) | Temp (° C.) | Pressure | Time (h) | Dislocation density (/cm$^2$) | Smoothness of critical surface |
| Ex. 2 | 200 | $5 \times 10^{17}$ | 1300 | 10 MPa | 5 | ~50 | Good |
| Comp. Ex. 2 | 200 | $5 \times 10^{17}$ | 1300 | Atmospheric pressure | 8 | ~400 | Good |

*1Substrate temperature in ion implantation: 550° C.
*2Atmospheric gas in annealing: Ar Samples in Example 1 and Comparative Examples 1, 1' were manufactured by performing ion implantation in the same condition to implant oxygen ion in a depth area of about 100 nm from the surface of a Si wafer with an implanting time of about 30 minutes and a considerably high oxygen dose of $2 \times 10^{18}$/cm$^2$. In Comparative Examples 1, 1' in which annealing was performed under a pressure close to general atmospheric pressure, dislocation occurred in large quantities in the surface Si layer part with a dislocation density in the order of $10^9$/cm$^2$, while defects in the surface Si layer were reduced in Example 1 in which the annealing was performed under a pressurized gas atmosphere of 100 MPa, resulting in a significant reduction in dislocation density to about $10^2$/cm$^2$.

The annealing was performed at 1350° C. in Comparative Example 1, while the annealing temperature is set to 1300° C. in Comparative Example 1' similarly to Example 1. In Comparative Example 1', smoothness of the critical surfaces of the buried oxide film with the Si layers nipping it was significantly lost.

Samples of Example 2 and Comparative Example 2 were manufactured according to the above-mentioned report that the dislocation density was significantly reduced when the dose of oxygen ion was set to about $4 \times 10^{17}$/cm$^2$. The dislocation density was about 400/cm$^2$ in Comparative Example 2 in which the annealing was performed under the atmospheric pressure, while the dislocation density was significantly reduced to about 50/cm$^2$ in the sample of Example 2 in which the annealing was performed under a pressurized gas atmosphere of 10 MPa.

Further, an annealing time of 8 hours was required until the formation of the buried oxide film was completed by the reaction of the implanted oxygen atom with Si atom in Comparative Examples 1, 2, while a buried oxide film having satisfactory smoothness in the critical surface with the Si layer was formed in Examples 1, 2 even when the annealing time is shortened to 5 hours since the reaction accompanied by diffusion of atom was quickly performed by the treatment under high pressure gas atmosphere.

As described so far, in the manufacture of a material or member having a composite tissue by the combination of ion implantation and thermal treatment, particularly, as represented by the SIMOX substrate, one having no defect as dislocation, not to mention pore-like defects, can be obtained according to the present invention. Thus, although the presence of these defects is fatal for the element in the manufacture of a device utilizing electronic properties as represented by ULIS, occurrence of these defects can be prevented by the present invention with an extremely great contribution to the industrial production. In these days, particularly, the degree of integration of ULIS is increasingly enhanced, and the processing level of element is being fined to 0.1–0.25 μm far lower than 1 μm. Since the problem of these defects becomes more serious as the fining is more advanced, the present invention is expected to highly contribute to the fining of the element in the future.

Since the occurrence of dislocation or large vacancies by integration of crystal defects occurring according to ion implantation can be prevented, in the present invention, by annealing a substrate to be processed under a pressurized gas atmosphere after the ion implantation, a substrate of good quality excellent in crystallinity which is suitable for the manufacture of ULIS, for example, can be manufactured.

What is claimed is:

1. A method for processing a substrate which comprises:
   implanting an ion to a substrate to be processed; and
   annealing the substrate to be processed under a pressurized gas atmosphere of 10 MPa or more.

2. A method for processing a substrate according to claim 1 wherein the ion is collectively implanted to the range of a specified depth from the surface of the substrate to be processed.

3. A method for processing a substrate according to claim 1 wherein the element of the implanted ion is reacted with the element of the substrate to be processed by the annealing to form a compound layer.

4. A method for processing a substrate according to claim 2 wherein the element of the implanted ion is reacted with the element of the substrate to be processed to form a compound layer.

5. A method for processing a substrate according to claim 4 wherein the substrate to be processed is a silicon monocrystal substrate, the element to be ion-implanted is oxygen, and the compound formed is silicon dioxide.

6. A method for processing a substrate according to claim 5 wherein the gas used as the pressured gas in the annealing is an inert gas or a mixture of an inert gas and oxygen.

7. A method for processing a substrate according to claim 1, wherein the annealing is under a pressurized gas atmosphere of about 100 MPa or more.

8. A method for processing a substrate according to claim 1, wherein the annealing is at a temperature equal to or higher than 1300° C.

9. A method for processing a substrate according to claim 8, wherein the annealing is at a temperature equal to or higher than 1300° C.

* * * * *